United States Patent
Ho et al.

(10) Patent No.: US 6,876,087 B2
(45) Date of Patent: Apr. 5, 2005

(54) CHIP SCALE PACKAGE WITH HEAT DISSIPATING PART

(75) Inventors: Kwun-Yao Ho, Taipei Hsien (TW); Moriss Kung, Taipei Hsien (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/248,714

(22) Filed: Feb. 12, 2003

(65) Prior Publication Data

US 2004/0036180 A1 Feb. 26, 2004

(30) Foreign Application Priority Data

Aug. 23, 2002 (TW) ........................................ 91119088 A

(51) Int. Cl.$^7$ ........................ H01L 23/495; H01L 23/48
(52) U.S. Cl. ........................ 257/778; 257/796; 257/684; 257/666; 257/696; 257/698; 257/737; 257/738; 257/784; 257/786; 257/787; 257/712; 257/675; 257/676; 257/673
(58) Field of Search ................................ 257/778, 712, 257/675, 666, 684, 696, 796, 692, 693, 784, 786, 787, 734, 737, 738, 783, 676, 673, 776, 753

(56) References Cited

U.S. PATENT DOCUMENTS

| | | | | |
|---|---|---|---|---|
| 5,648,682 A | * | 7/1997 | Nakazawa et al. | 257/673 |
| 5,933,709 A | * | 8/1999 | Chun | 438/122 |
| 6,130,477 A | * | 10/2000 | Chen et al. | 257/712 |
| 6,184,580 B1 | * | 2/2001 | Lin | 257/712 |
| 6,242,798 B1 | * | 6/2001 | Cha et al. | 257/673 |
| 6,376,769 B1 | * | 4/2002 | Chung | 174/52.2 |
| 6,414,385 B1 | * | 7/2002 | Huang et al. | 257/690 |
| 6,465,876 B1 | * | 10/2002 | Kitano et al. | 257/668 |
| 6,590,281 B2 | * | 7/2003 | Wu et al. | 257/684 |
| 6,597,059 B1 | * | 7/2003 | McCann et al. | 257/673 |
| 6,723,585 B1 | * | 4/2004 | Tu et al. | 438/123 |
| 2003/0094677 A1 | * | 5/2003 | Cheng | 257/676 |
| 2004/0016995 A1 | * | 1/2004 | Kuo et al. | 257/678 |

FOREIGN PATENT DOCUMENTS

| JP | 8-116016 | * | 5/1996 |
|---|---|---|---|
| JP | 10-50921 | * | 2/1998 |

* cited by examiner

Primary Examiner—Alexander Oscar Williams
(74) Attorney, Agent, or Firm—Jiang Chyun IP Office

(57) ABSTRACT

In a chip scale package, a chip is mounted in a cavity formed in a leadframe. The leadframe includes a plurality of leads that radiate from a heat dissipating part located in the cavity. Each lead extends from a thinner portion of inner lead in the cavity to a thicker portion of outer lead outside the cavity. The chip includes a plurality of bonding pads on which is respectively formed a layer of connecting material. The chip is attached on the heat dissipating material, and via the layer of connecting material, is electrically connected to the inner leads by thermal pressing. Via molding, the chip is encapsulated in the leadframe. The achieved package has a dimensional size that is approximately equal to that of the leadframe with an improved thermal dissipation.

5 Claims, 7 Drawing Sheets

CHIP SCALE PACKAGE WITH HEAT DISSIPATING PART

CROSS REFERENCE TO RELATED APPLICATIONS

This application claims the priority benefit of Taiwanese application serial no. 91119088, filed on Aug. 23, 2002.

BACKGROUND OF INVENTION

1. Field of the Invention

The invention relates generally to a chip scale package and a manufacturing method therefor. More particularly, the invention provides a chip scale package that is constructed from a leadframe carrier.

2. Description of the Related Art

Chip scale package technology is increasingly developed to further miniaturize electronic devices with higher density. A chip scale package is usually defined as a packaging structure the length of which is below 1.2 times that of the packaged chip or, alternatively, as a packaging structure that has a chip to package surface area ratio greater than 80%. Surface mount technology (SMT) is conventionally used to electrically connect the chip scale package on a printed circuit board. The most common chip scale packages include bump chip carrier (BCC) packages, quad flat nonleaded (QFN) packages, and leadframe type packages.

FIG. 1 is a schematic view that illustrates a conventional BCC package. As illustrated, a BCC package known in the prior art comprises a chip 100, an adhesive layer 104, a plurality of conductive wires 106, a plurality of terminals 108, and an encapsulating body 110. The chip 100 is attached on the adhesive layer 104, and has a plurality of bonding pads 102 that are electrically connected to the terminals 108 via the conductive wires 106. The encapsulating body 110 covers the chip 100 and the conductive wires 106, while exposing a lower surface of the adhesive layer 104 to promote heat dissipation. The terminals 108 are externally exposed to allow electrical connection of the package on a circuit board via SMT (not shown). To expose the adhesive layer 104 through the encapsulating body 110 and form the terminals 108, etching is usually required, which may complicate the manufacturing process.

FIG. 2 is a schematic view that illustrates a QFN package known in the prior art. As illustrated, a QFN package of the prior art is constructed from a leadframe 208 that comprises a die pad 208a and a plurality of leads 208b. A chip 200, having an active surface provided with a plurality of bonding pads 202, is attached on the die pad 208a via an adhesive layer 204, and is electrically connected via conductive wires 206. Some of the bonding pads 202 are electrically connected to the leads 208b via conductive wires 206b, while other bonding pads 202 are grounded by electrically connecting the die pad 208a via conductive wires 206a. An encapsulating body 210 covers the chip 200, the adhesive layer 204, and the conductive wires 206a, 206b, while exposing a lower surface of the die pad 208a and a portion of the leads 208b to respectively dissipate heat and achieve the external electrical connection.

FIG. 3 is a schematic view that illustrates a leadframe type package known in the prior art. As illustrated, a known leadframe type package is constructed from a carrier leadframe 308 that comprises a die pad 308a and a plurality of leads 308b. A chip 300, having an active surface provided with a plurality of bonding pads 302, is attached on the die pad 308a via an adhesive layer 304. The bonding pads 302 are electrically connected to the leads 308b via conductive wires 306. An encapsulating body 310 respectively covers the chip 300, the adhesive layer 304, the conductive wires 306, the die pad 308a, and partially the leads 308b. A portion of the leads 308a is externally exposed for external electrical connections. Heat dissipation in this type of package is typically performed via the leads or an additional heat sink, which may be insufficient with respect to the amount of heat irradiated from the packaged chip.

Furthermore, all of the aforementioned packages use bonding or conductive wires to establish the electrical connection of the chip within the package, which limits the dimensional reduction of the package. Compared to flip chip connection, wire bonding connection further has a longer signal path, which produces undesirable parasitic inductance effects. To achieve flip chip connection, the chip usually needs undergo an additional redistribution step. This redistribution rearranges the positions of the bonding pads, usually laid peripherally around the chip in wire bonding connection, in an area array distribution with larger pitches between the bonding pads. Unfortunately, this bonding pad redistribution increases the circuit length, which also causes parasitic inductance effects.

SUMMARY OF INVENTION

An aspect of the invention is therefore to provide a chip scale package and a manufacturing method therefor that can reduce the thickness of the package and shorten the signal path.

To achieve the above and other objectives, a chip scale package of the invention comprises a leadframe, a chip assembled with the leadframe, and an encapsulant. The leadframe includes a heat dissipating part and a plurality of leads that radiate from the heat dissipating part. Each of the leads extends from a portion of inner lead having a first thickness proximate to the heat dissipating part to a portion of outer lead having a second thickness greater than the first thickness. The leadframe is thereby provided with a cavity in which is located the heat dissipating part and the inner leads. The chip includes an active surface on which are formed a plurality of bonding pads. A layer of connecting material such as flip chip connecting materials is respectively formed on the bonding pads. The chip is mounted in the cavity of the leadframe, being attached on the heat dissipating part. The bonding pads respectively electrically connect the inner leads via the layer of connecting material. The chip is encapsulated in the leadframe via the encapsulant that leaves exposed the rear surface of the chip and the outer leads.

In accordance with the above and other objectives, the invention further provides a manufacturing method of a chip scale package. The manufacturing method starts with the provision of a conductive substrate having a first thickness. A portion of the conductive substrate is removed to form a cavity in the conductive substrate. The conductive substrate thereby has a second thickness at a location corresponding to the cavity that is smaller than the first thickness. The conductive substrate is patterned to form a leadframe provided with a plurality of leads that radiate from a heat dissipating part, located in the cavity. Each of the leads extends from a portion of inner lead, having the second thickness proximate to the heat dissipating part, to a portion of outer lead having the first thickness. A chip, having an active surface provided with a plurality of bonding pads, is mounted in the cavity of the leadframe. A layer of connecting material is respectively formed on the bonding pads. The chip is mounted in the cavity of the leadframe with the layer of connecting material respectively contacting with the inner leads, and a portion of the active surface being attached on the heat dissipating part of the leadframe. Via thermal pressing bonding, the bonding pads are electrically connected through the layer of connecting material to the inner leads. An encapsulating process then is performed to encapsulate the chip in the cavity, exposing a rear surface of the chip and the outer leads. Lastly, by punching, an individual package unit is achieved.

According to an embodiment of the invention, the layer of connecting material includes flip chip connecting materials such as gold stud bumps formed by wire bonding technology or plating.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
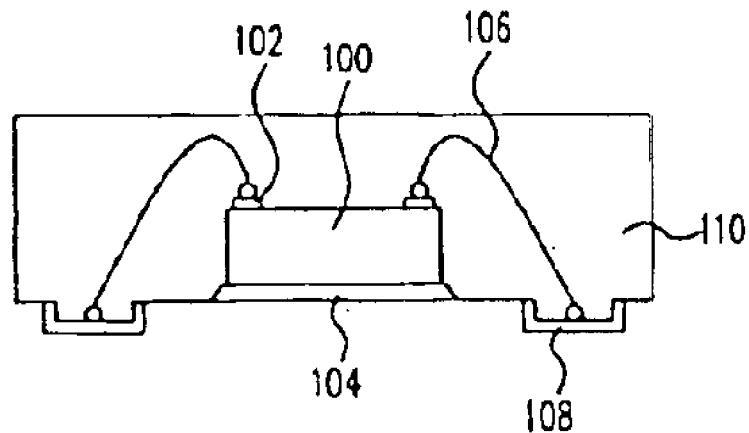
FIG. 1 is a schematic view of a bump chip carrier package known in the prior art.
Figure 2:
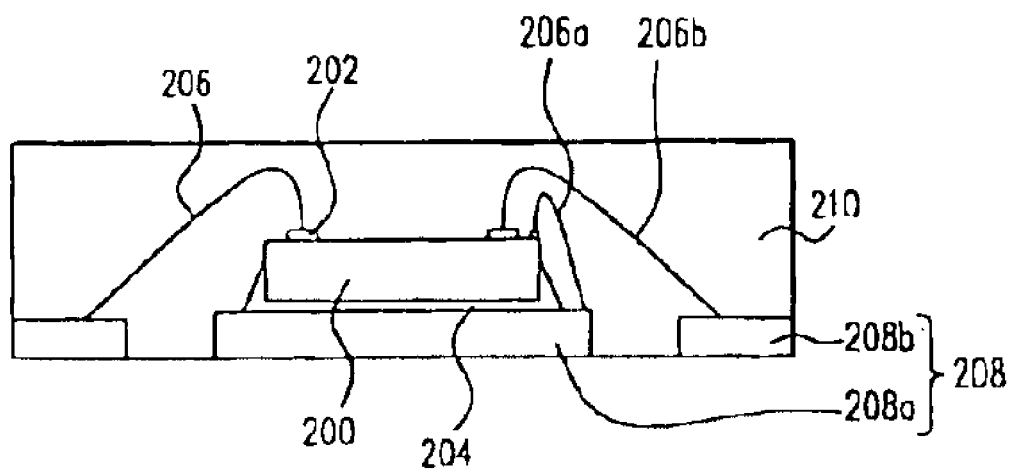
FIG. 2 is a schematic view of a quad flat nonleaded package known in the prior art.
Figure 3:
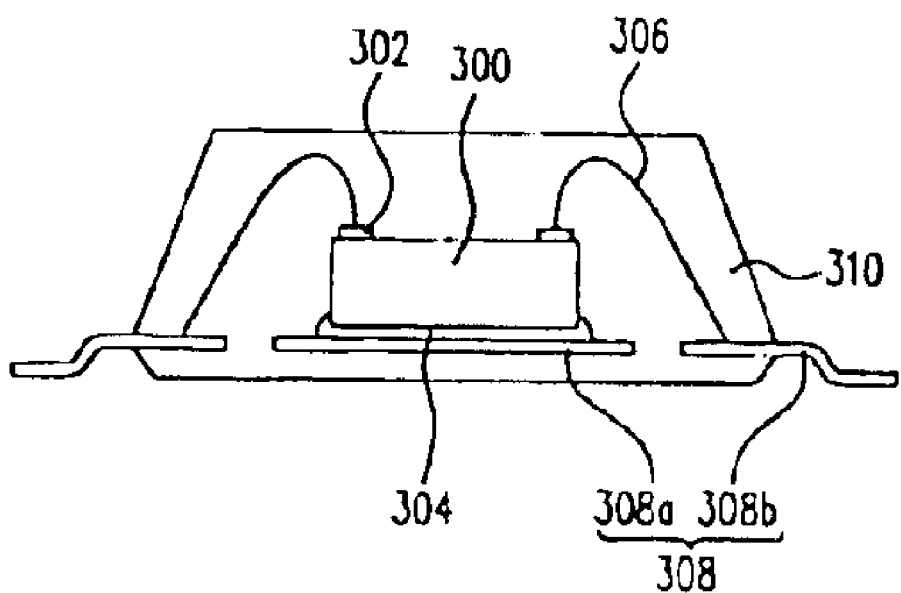
FIG. 3 is a schematic view of a leadframe type package known in the prior art.

The following detailed description of the embodiments and examples of the present invention with reference to the accompanying drawings is only illustrative and not limiting. Furthermore, wherever possible in the description, the same reference symbols will refer to similar elements and parts unless otherwise illustrated in the drawings.

Figure 4:
FIG. 4 through FIG. 9 are side views schematically illustrating a manufacturing process for a chip scale package according to an embodiment of the invention.

Reference now is made to FIG. 4 through FIG. 9 to describe the manufacturing method of a chip scale package according to a first embodiment of the invention. As illustrated in FIG. 4, the manufacturing method starts with the provision of a conductive substrate 402 having a thickness D1. The conductive substrate 402 may be, for example, a copper foil having a thickness D1 between about 100 microns and 400 microns.

Figure 5:
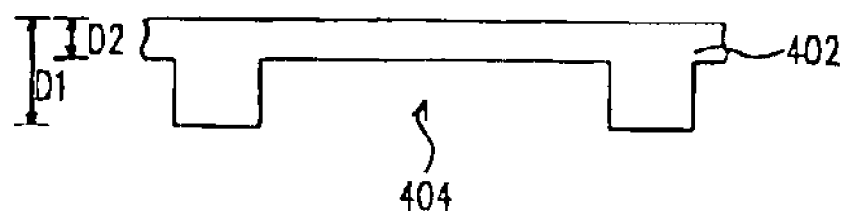

Referring to FIG. 5, to accommodate a chip, a portion of the conductive substrate 402 is removed by etching so that the conductive substrate 402 is correspondingly reduced to a thickness D2 slightly greater than that of a chip. A cavity 404, having a depth equal to D1–D2, is thereby formed in the conductive substrate 402 to receive the mount of an integrated circuit (IC) chip.

Figure 6:
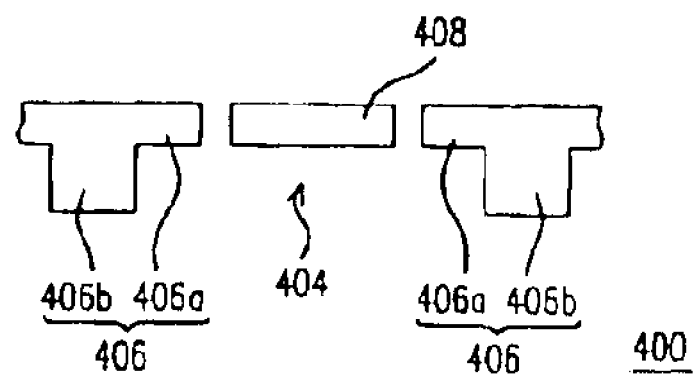
Figure 10:
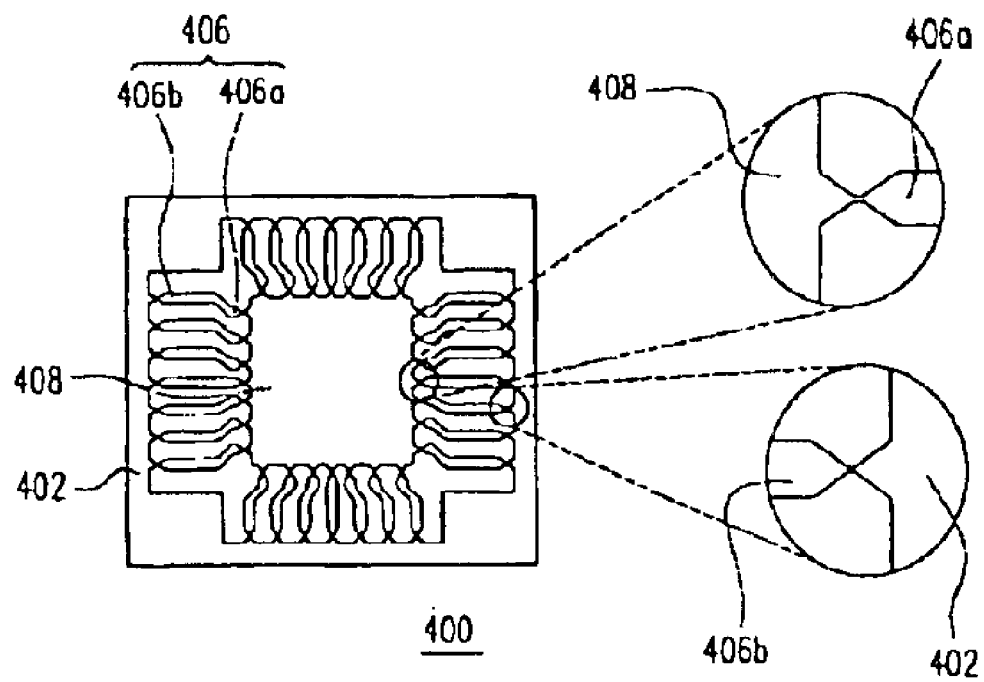
FIG. 10 through FIG. 13 are bottom planar views respectively corresponding to FIG. 6 through FIG. 9.

Referring to FIG. 6 and FIG. 10, the conductive substrate 402 is patterned to form a leadframe 400 including the cavity 404 therein. The formed "cavity" leadframe 400, in reference to a leadframe provided with a cavity therein, thereby includes a plurality of leads 406 and a heat dissipating part 408. The leads 406 radiate from the heat dissipating part 408 by respectively extending from a portion of inner leads 406a, of a thickness between about 50 and 100 microns, to a portion of outer leads 406b, of a thickness between about 100 and 400 microns. As it is better shown in FIG. 10, the connecting portion between an inner lead 406a and the heat dissipating part 408 may be initially formed in a dimensionally reduced bridge that is easily broken to separate the inner lead 406a from the heat dissipating part 408. The connecting part between each outer lead 406b and the outer periphery of the conductive substrate 402 may be designed according to a similar manner to facilitate its separation. The connecting portions between the inner leads 406b and the heat dissipating part 408 are subsequently broken to electrically isolate the inner leads 406b from the heat dissipating part 408.

In the present embodiment, the heat dissipating part 408 is preferably grounded so that in addition to heat dissipation, it also acts as electromagnetic interference shield. As it is known in the art, the electrical connection of some of the leads 406 may also be grounded. The heat dissipating part 408 can be therefore grounded by, for example, connecting to the grounded leads. This may be achieved via, for example, leaving some of the connecting bridges between the leads and the heat dissipating part unbroken, or ground connecting the heat dissipating part without the link of the connecting bridges.

Figure 7:
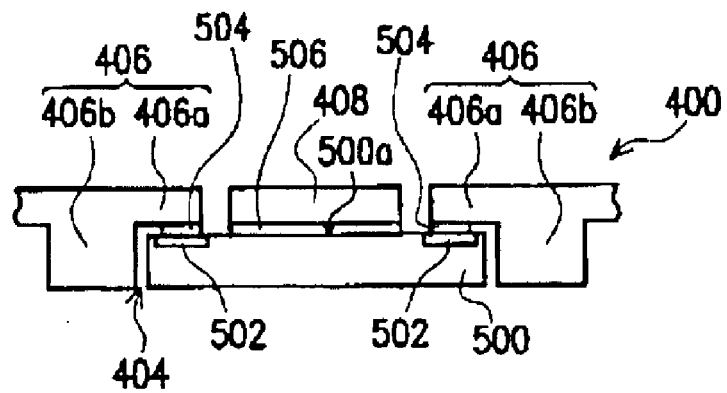
Figure 11:
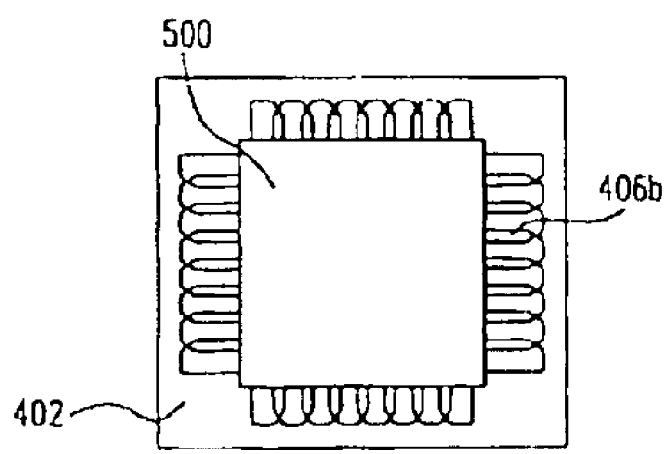

FIG. 11 is a bottom planar view of FIG. 7. As illustrated in FIG. 7 and FIG. 11, a chip 500 is mounted in the cavity 404 of the leadframe 400. The chip 500 includes an active surface 500a on which are formed a plurality of bonding pads 502. The bonding pads 502 may be arranged either according to a distribution adapted to wire bonding connection or a distribution adapted to flip chip connection. To electrically connect the chip 500, a layer of connecting material 504 is respectively formed on the bonding pads 502. The layer of connecting material 504 includes, but is not limited to, for example, connecting materials commonly used in the art to achieve flip chip connection such as gold stud bumps or tin/lead-comprising stud bumps formed via, for example, wire bonding technology or plating. The chip 500 is mounted inside the cavity 404 with the layer of connecting material 504 respectively contacting with the inner leads 406a, and a portion of the active surface 500a being attached to the heat dissipating part 408 via an adhesive layer 506. Via thermal pressing, the bonding pads 502, through the layer of connecting material 504, are bonded and electrically connected to the inner leads 406a.

Figure 8:
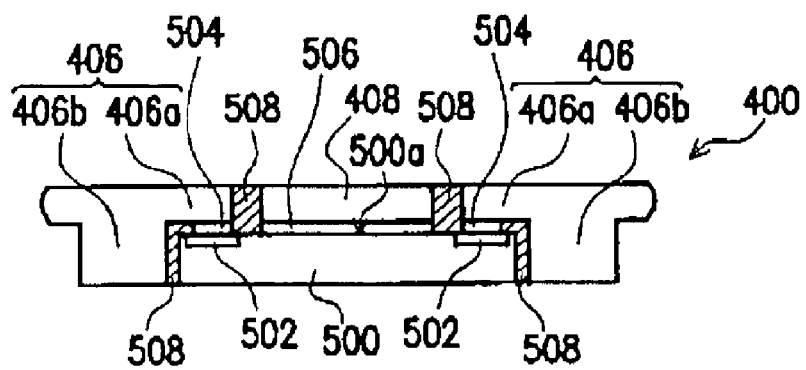
Figure 12:
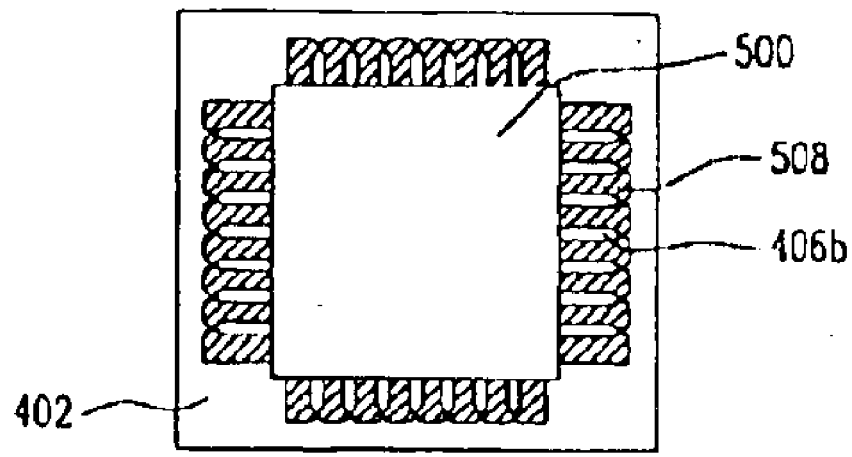

Referring to FIG. 8 and FIG. 12, an encapsulation process is subsequently performed to encapsulate the chip 500 in the leadframe 400 with an encapsulant 508. The chip 500 is thereby assembled within the leadframe 400 in a single body.

Figure 9:
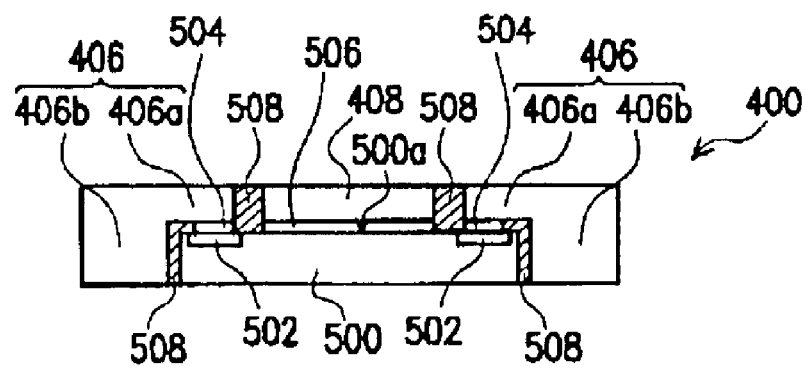
Figure 13:
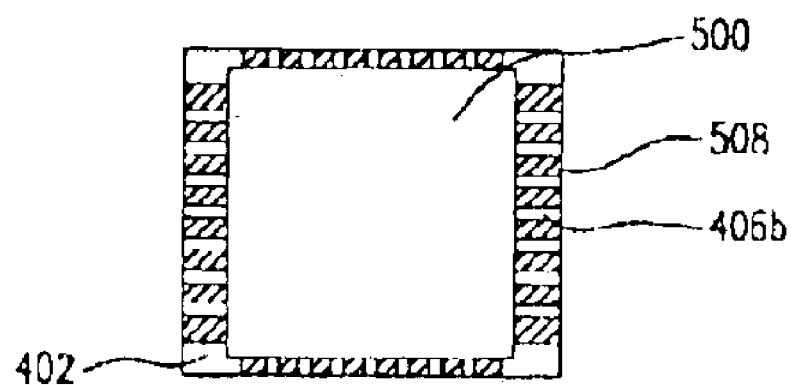

Referring to FIG. 9 and FIG. 13, an individual package unit is formed via punching or singulation of the leadframe 400. As illustrated, the structure of the final package unit includes leads 406 that radiate from the heat dissipating part 408 to form the cavity 404. The leads 406 respectively have a thicker portion of a thickness D1, defining the inner leads 406a within the cavity 404, and a thinner portion of a thickness D2 defining the outer leads 406b around the cavity 404. The chip 500 is mounted within the cavity 404, being attached on the heat dissipating part 408, and electrically connected to the inner leads 406a via the layer of connecting material 504. The encapsulant 508 fills spacing gaps between the chip 500 and the leadframe 400, and leaves the rear surface of the chip 500 and the outer leads 406b exposed.

As illustrated, the achieved package unit is favorably compact, and has a dimensionally reduced size that has a thickness approximately equal to that of the leadframe 400. The heat dissipation is promoted via the exposure of the rear surface of the chip 500 and the attachment of the active surface 500a of the chip 500 on the heat dissipating part 408 of the leadframe 400. As described above, the thickness D1 achieved in this embodiment is between about 350 microns and 400 microns, and the thickness D2 such that (D1–D2) is slightly greater than the thickness of the chip.

The above package structure is similarly suitable for packaging IC chips that have a bonding pad distribution adapted to flip chip connection and IC chips that have a bonding pad distribution adapted to wire bonding connection. Furthermore, if the leadframe is provided with more than one cavities formed according to the same manner as disclosed above, a plurality of chips accordingly can be packaged within the leadframe to form a multi-chip package.

Figure 14:
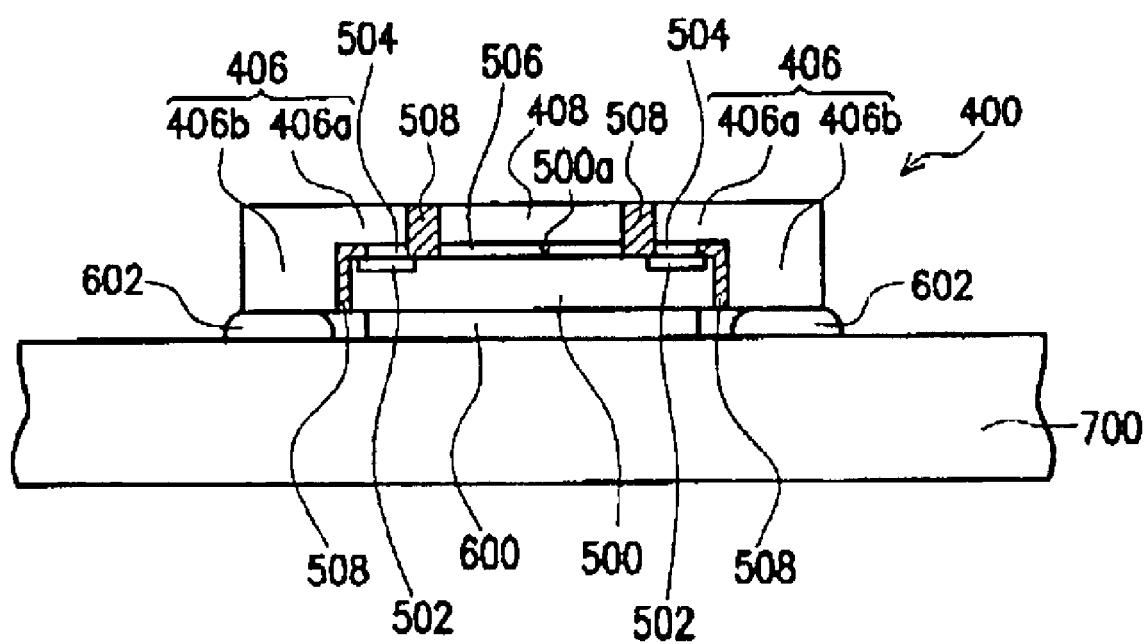
FIG. 14 is a schematic view illustrating the assembly of the chip scale package of FIG. 9 with a printed circuit board.

Referring to FIG. 14, a schematic view illustrates the mount of the chip scale package on a printed circuit board according to an embodiment of the invention. As illustrated, the chip scale package, once achieved, may be mounted on printed circuit board (PCB) 700. A layer of connecting material 602, including but not limited to, for example, a solder paste, is respectively formed on the outer leads 406b to establish the electrical connections and bonding between the PCB 700 and the chip scale package. A heat sink 600 may be further interposed between the PCB 700 and the exposed rear surface of the chip 500 to promote heat dissipation through the PCB 700.

The invention as described above therefore includes at least the following advantages.

1. By mounting the chip in the cavity of the leadframe, the chip scale package of the invention is compact and has dimensionally reduced size and thickness.

2. The leadframe includes a heat dissipating part in the cavity on which is attached the chip, which thereby promotes heat dissipation. The heat dissipating part being grounded, it further acts as electromagnetic interference shield.

3. The chip is electrically connected to the leads according to a flip chip construction, which thereby shortens the signal path and favorably reduces parasitic inductance effects.

4. The manufacturing method of the invention involves a smaller number of processing steps, which therefore reduces the manufacturing cost.

It should be apparent to those skilled in the art that other structures that are obtained from various modifications and variations of different parts of the above-described structures of the invention would be possible without departing from the scope and spirit of the invention as illustrated herein. Therefore, the above description of embodiments and examples only illustrates specific ways of making and performing the invention that, consequently, should cover variations and modifications thereof, provided they fall within the inventive concepts as defined in the following claims.

What is claimed is:

1. A structure of a chip scale package (CSP) on a printed circuit board, comprising:

a chip, having a chip thickness and a plurality of exposed bonding pads;

a leadframe, including a heat dissipating part and a plurality of leads that radiate from the heat dissipating part, each of the leads extending from an inner lead portion having a first thickness proximate to the heat dissipating part and an outer lead portion having a second thickness greater than the first thickness, wherein a difference of the first thickness and the second thickness is slightly greater than the chip thickness;

an adhesive layer, used to adhere the chip to the heat dissipating part;

a first connecting material layer, used to allow the bonding pads to electrically connect to the inner lead portion when the chip is adhered to the heat dissipating part;

an encapsulant, encapsulating the chip in the leadframe, wherein the dissipating part has an exposed surface opposite to the chip, wherein the exposed surface of the heat dissipating part and a surface of the loads have the same level, wherein a surface of the chip opposite to the heat dissipating part is exposed and is substantially at a same surface level with the outer lead portion; and a circuit board; and a second connecting material layer, located on the outer lead with the second thickness, used to allow the outer lead portion to be electrically contact with the circuit board, wherein the heat dissipating part remained exposed.

2. The structure of claim 1, wherein the first connecting material layer includes an electric connecting bump with direct contact between the chip and the inner lead portion.

3. The structure of claim 1, wherein the second connecting material layer includes solder paste.

4. The structure of claim 1, further comprising an additional heatsink layer between a rear surface of the chip and the circuit board, at a space defined by the second connecting material layer.

5. The structure of claim 1, wherein the second thickness of the outer lead is substantially uniform.

* * * * *